United States Patent [19]

Eakin

[11] Patent Number: 5,621,652

[45] Date of Patent: Apr. 15, 1997

[54] SYSTEM AND METHOD FOR VERIFYING PROCESS MODELS IN INTEGRATED CIRCUIT PROCESS SIMULATORS

[75] Inventor: John C. Eakin, Foster City, Calif.

[73] Assignee: VLSI Technology, Inc., San Jose, Calif.

[21] Appl. No.: 408,856

[22] Filed: Mar. 21, 1995

[51] Int. Cl.$^6$ .............................. G06F 17/50; G06G 7/48
[52] U.S. Cl. ...................... 364/490; 364/488; 364/578
[58] Field of Search ..................................... 364/488, 489, 364/490, 491, 578; 382/144, 145, 147

[56] References Cited

U.S. PATENT DOCUMENTS

| | | | |
|---|---|---|---|
| 4,894,790 | 1/1990 | Yotsuya et al. | 364/552 |
| 5,307,296 | 4/1994 | Uchida et al. | 364/578 |
| 5,307,421 | 4/1994 | Darboux et al. | 382/8 |
| 5,319,564 | 6/1994 | Smayling et al. | 364/468 |
| 5,416,729 | 5/1995 | Leon et al. | 364/578 |

OTHER PUBLICATIONS

Beacham et al., "Applications of an Atomic Force Metrology System in Semiconductor Manufacturing", *SPIE* 1926: 311–321 (1993).
Peters, "AFMs: What Will Their Role Be?", *Semiconductor International* pp. 62–68, Aug. 1993.
*Prolith/2 User's Manual*, Finle Technologies, Fourth Edition, Jul. 1993.
Barouch et al., "Modelling Process Latitude in UV Projection Lithography," IEEE Electron Device Letters, vol. 12, No. 10, Oct. 1991, pp. 513–514.
Crisalle et al., "A Comparison of the Optical Projection Lithography Similators in SAMPLE and PROLITH," IEEE Trans. on Semiconductor Manufacturing, vol. 5, No. 1, Feb. 1992, pp. 14–26.
Gopalarao et al., "An Integrated Technology CAD System for Process and Device Designers," IEEE Trans. on VLSI Systems, vol. 1, No. 4, Dec. 1993, pp. 482–490.
Neubauer et al., "Imaging VLSI Cross Sections by Atomic Force Microscopy," 1992 IEEE/IRPS, pp. 299–303.
Rodgers, "Application of the Atomic Force Microscope to Integrated Circuit Reliability and Failure Analysis," 1991 IEEE/IRPS, pp. 250–254.
Qian et al., "A New Scalar Planewave Model for High NA Lithography Simulations," 1994 IEEE/NUPADV, pp. 45–48.

*Primary Examiner*—Kevin J. Teska
*Assistant Examiner*—Leigh Marie Garbowski
*Attorney, Agent, or Firm*—Flehr, Hohbach, Test, Albritton & Herbert

[57] ABSTRACT

An apparatus and method for verifying a semiconductor process model. The apparatus consists of an atomic force microscope (AFM), a semiconductor process model and a model updater. The AFM measures an actual cross sectional profile of a submicron semiconductor device feature created by an IC processing step which could be photolithography. The semiconductor process model predicts the feature's cross sectional profile under a set of model conditions specified to match the actual conditions under which the IC processing step took place. The semiconductor process model is driven by a set of model parameters that relate feature profiles to processing conditions and details of the processing step being modelled. The model updater adjusts, if necessary, the model parameters of the semiconductor process model so that the predicted profile more closely approximates the actual cross sectional profile. If the parameters are adjusted, the process model generates an updated predicted profile, which the model updater again compares to the actual profile. This process iterates until the model updater determines that the predicted and actual profiles are suitably correlated, at which point the process model is verified. Once verified, the process model of the present invention can be configured to output a sequence of processing steps compatible with an IC manufacturing process. Thus, the verified process model can specify the steps by which a device characterized by a specified profile can be manufactured.

9 Claims, 4 Drawing Sheets

SYSTEM AND METHOD FOR VERIFYING PROCESS MODELS IN INTEGRATED CIRCUIT PROCESS SIMULATORS

The present invention relates generally to integrated circuit processing methods and particularly to integrated circuit (IC) metrology for verification of process models used by IC process simulations.

BACKGROUND OF THE INVENTION

The present invention is an improvement of prior art methods for verifying IC process simulations.

The manufacture of integrated circuits is a complicated and expensive process sometimes involving dozens of process steps. To ensure that this manufacturing effort is not wasted, steps of the IC fabrication process are often modelled in process simulators to determine beforehand whether resulting device features will have the desired width, thickness, cross-sectional profile, etc.

One of the critical steps in IC manufacturing is photolithography, which is used to define key features of an integrated circuit, including active regions, transistor gates, and signal and interconnect lines. In photolithography, a photosensitive polymer photoresist is deposited on a silicon substrate, exposed by a patterned light, then chemically developed. Depending on the type of photoresist, during developing the exposed photoresist is removed (positive photoresist) or retained in preference to the unexposed photoresist (negative photoresist), which results in the formation of a patterned photoresist. Using the patterned photoresist as a mask, further IC processing steps can then occur, possibly including etching and ion implantation, oxide growth or metallization for signal lines or interconnects.

Ideally, IC features created by photolithography would have straight, vertical sidewalls. However, in reality, the sidewalls of a photolithographically defined IC feature can deviate substantially from straight and vertical, which can cause problems in subsequent IC processing steps. FIG. 1, which is a cross sectional view of a resist feature (the shaded region represents unexposed positive photoresist remaining after developing) formed by photolithography, shows two possible sidewall deviations. The first, sidewall scalloping 102, is caused by standing waves set up in the photoresist due to interference of the light used to expose the photoresist. Assuming a positive resist, when the exposed photoresist is subsequently developed, sidewall areas of the photoresist which were underexposed (i.e., in an interference intensity minimum) will not be removed; areas that were overexposed (i.e., in an intensity maximum) will be removed. As a result, the sidewalls of the remaining photoresist in FIG. 1 show a scalloped pattern with trough to peak variations that could be as much as 25% of the width of the areas between the sidewalls. Accordingly, this scalloping can dramatically affect the size of features, especially linewidths, resulting from the subsequent processing steps (e.g., a signal line might be 25% wider or narrower than desired).

The second, a non-vertical sidewall angle/slope 104, is primarily a function of resist contrast, numerical aperture and partial coherence. As FIG. 1 shows, a typical sidewall angle 104 results in a trench in a 1.3 μm-thick resist that has a cross-sectional width that varies from approximately 0.5 μm at the top of the trench to approximately 0.6 μm at the bottom of the trench. Thus, as with scalloping, a pronounced sidewall angle could significantly alter the dimensions of features defined through photolithography. Consequently, it is extremely important that these sidewall characteristics are accurately modelled by process simulators.

Existing process simulators, such as PROLITH/2™ and SAMPLE™ model sidewall scalloping and angle and other effects of a particular photolithographic process. Results from these simulators are typically verified through scanning electron microscope (SEM) examination of a cross section and feature widths of a photolithographically defined surface. However, while SEM verification is adequate for relatively large-scale features (i.e., a few microns and up), SEMs are generally not able to capture critically important cross-sectional details, such as sidewall scalloping and angle, of features defined by submicron photolithography.

This is because SEMs charge the resist sample under examination with electrons, which has the effect of blurring surface edges on photographs taken of the imaged surface. While blurring is not a significant problem for surfaces with macroscopic features, it tends to obliterate submicron details such as sidewall angle and scalloping. Another problem with SEM metrology is that, typically, IC feature sizes are determined by direct measurement of the SEM photographs with a precision ruler. Besides the obvious problem of making measurements from the blurred edges described above, direct measurement can result in additional errors due to (1) incorrect placement of the ruler on the edge of a photographed feature (assuming the feature edge is identifiable) and (2) the difficulty of measuring the pitch or angle of a cross-sectional feature with a ruler. In the case of submicron devices, these errors can amount to a significant percentage of the feature being imaged. Additionally, SEMs can physically alter the device features being measured.

Other aspects of process models in need of verification include basic process variables such as the developing rate associated with a particular developing solution. By developing a semiconductor wafer in stages and measuring the change in surface profile after each stage, developing rates can be better quantified, resulting in a more accurate process model. However, given the above mentioned measurement errors associated SEM surface imaging, it is not possible to accurately quantify such process variables using SEM metrology.

Moreover, given the inherent lack of reliability (i.e., reproducability of measurements) of SEM metrology as applied to submicron features, it is not possible to use SEM measurements to iteratively adjust the process simulator to model better the results of a particular IC manufacturing process. That is, the SEM is better suited to rough verification of a model rather than incremental improvement of a model.

Finally, given the current lack of a reliable method for verifying and updating process models with respect to submicron IC device features, it is not currently possible to modify IC manufacturing/processing steps in accordance with the predictions of an improved process simulator.

Consequently, there is a need for an IC process model verification system that incorporates a measuring device that can accurately measure the cross sections of submicron device features. There is also a need for an IC process model verification system that can update the IC process model based on those accurate cross-sectional measurements. Finally, there is a need for an IC process model verification system that generates an updated set of IC processing steps reflecting the updated IC process model.

SUMMARY OF THE INVENTION

In summary, the present invention is an improved method and system for IC process model verification that satisfies the needs set out above.

The present invention is an apparatus for verifying a semiconductor process model. The apparatus consists of an atomic force microscope (AFM), a semiconductor process model and a model updater. The AFM is used to measure an actual cross sectional profile, including feature widths, of a semiconductor device feature created by an IC processing step. The semiconductor process model predicts the feature's cross sectional profile under a set of model conditions specified to match the actual conditions under which the IC processing step took place. The semiconductor process model is driven by a set of model parameters that relate feature profiles to processing conditions and details of the processing step being modelled. The model updater adjusts, if necessary, the model parameters of the semiconductor process model so that the predicted profile more closely approximates the actual cross sectional profile. If the parameters are adjusted, the process model generates an updated predicted profile, which the model updater again compares to the actual profile. This process iterates until the model updater determines that the predicted and actual profiles are suitably correlated.

Where the simulated IC process is photolithography, the features measured by the AFM, predicted by the simulator, and compared by the model updater include patterned photoresist sidewall scalloping and angle.

Additionally, the process model of the present invention can be configured to output a sequence of processing steps compatible with an IC manufacturing process. Thus, after being adjusted as described above, the process model can specify the steps by which a device characterized by the actual profile, environment and process characteristics can be manufactured.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 2:
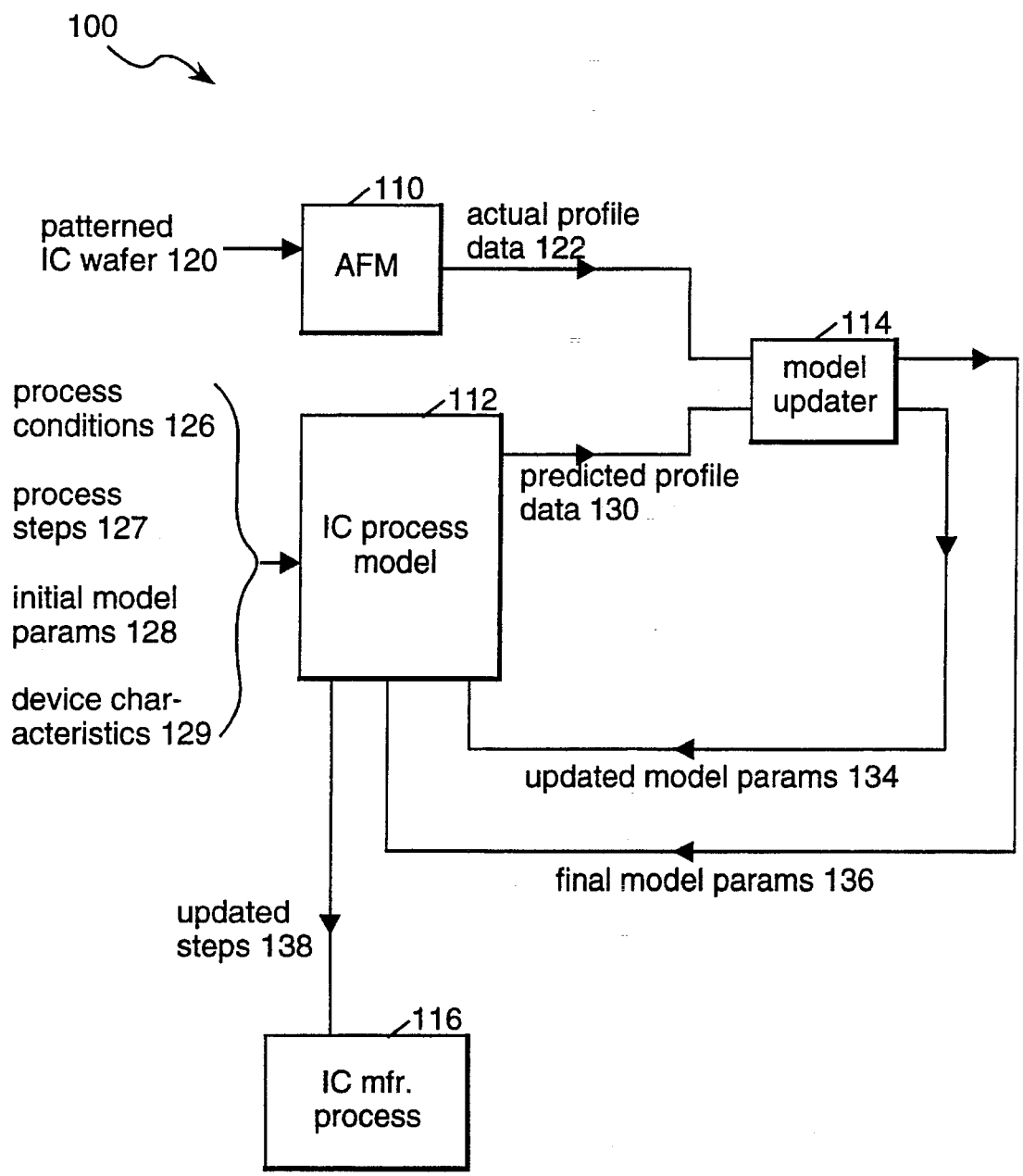
FIG. 2 is a block diagram of the IC process model verification system.

In FIG. 2 there is shown a block diagram of the present invention, which includes an atomic force microscope imaging system (AFM) 110, an IC process model 112, a model updater 114, and an IC manufacturing process 116. The steps of the IC process simulation verification method are shown in FIG. 4.

Figure 4:
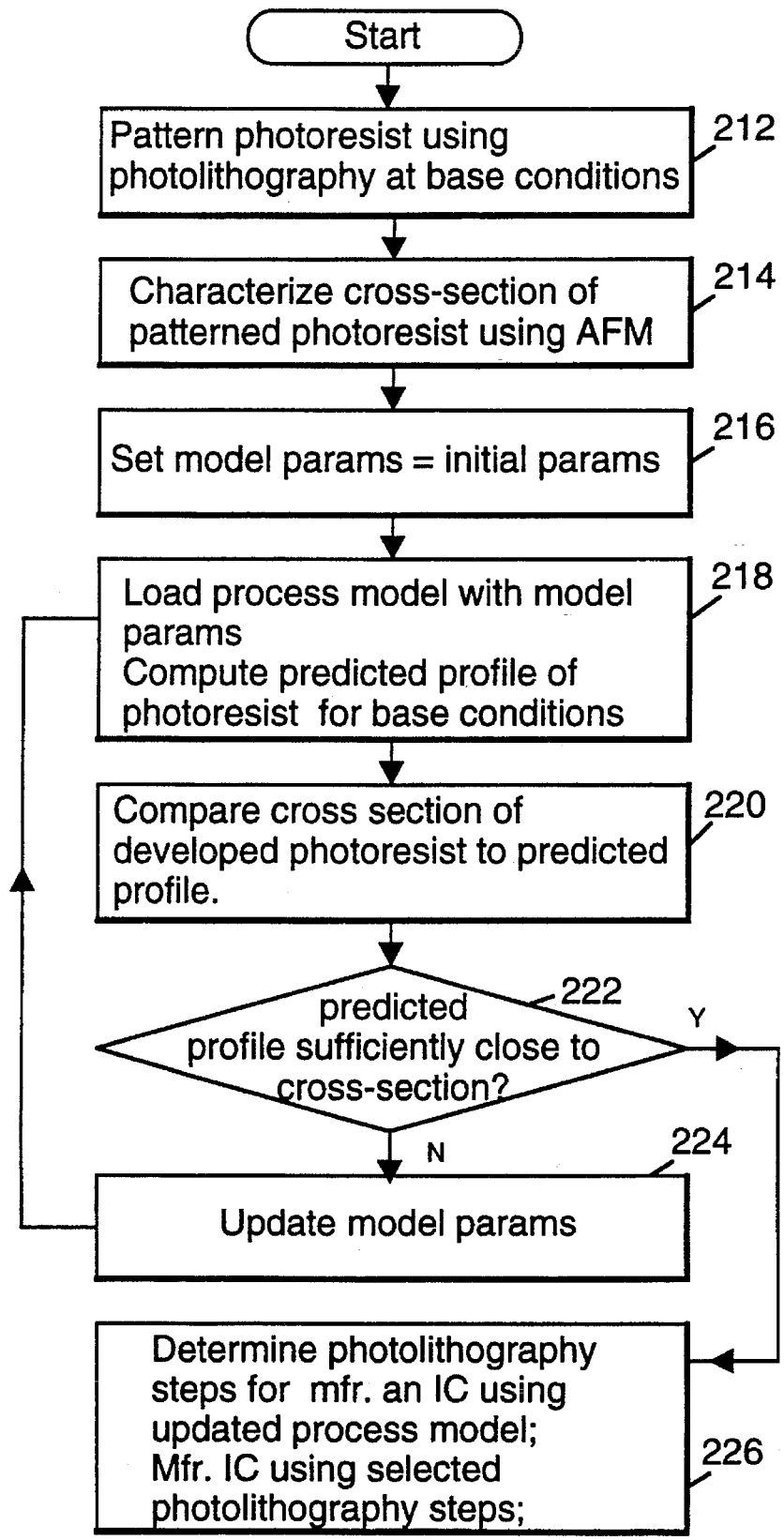
FIG. 4 is a flow diagram of the IC process model verification method.

Referring to FIGS. 2 and 4, the AFM 110 is employed by the present invention to image the surface of a patterned IC wafer 120 (214) following an IC processing step (212). After imaging the wafer 120, the AFM outputs to the model updater 114 actual profile data 122 characterizing a cross section of the wafer 120.

The IC process model 112 computes a predicted profile 130 of the IC wafer 120 by modelling the IC processing steps 127 used to manufacture the patterned IC wafer 120 for a given set of process conditions 126 (218). For example, in the preferred embodiment, the process modelled is photolithography, so the conditions 126 include characteristics of the light used to expose the photoresist, the optical system, the type of resist, and the chemical developer. The IC process model 112, which is driven by an adjustable set of model parameters, is initially loaded with a set of initial model parameters 128 (216). Following each iteration of the model verification process, the IC process model is loaded with a set of updated model parameters 134 (224) generated by the model updater 114. When the model updater determines that the actual and predicted profile data are in suitably close agreement (222-Y), the IC process model is loaded with a set of final model parameters 136 from the model updater 114.

Based on the final model parameters 136, the IC process model 112 generates the steps of the IC manufacturing process required to produce IC devices with a specified device pattern and specified device characteristics 129 (226). Those processing steps 138 are used in an IC manufacturing process 116 to manufacture IC devices.

The model updater 114 processes the actual profile data 122 and predicted profile data 130 and outputs an updated 134 or final 136 set of model parameters to the IC process model 112 depending on whether the predicted profile 130 is too different from (updated) or sufficiently similar to (final) the actual profile 122 (220).

The IC manufacturing process 116 is responsible for implementing the sequence of IC process steps 138 output by the IC process model 112 based on the specified feature characteristics of the IC to be manufactured 129, final model parameters 136 and process conditions 126.

Details of the AFM 110, IC process model 112, and model updater 114 are set out in greater detail below.

Atomic Force Microscope

Figure 3:
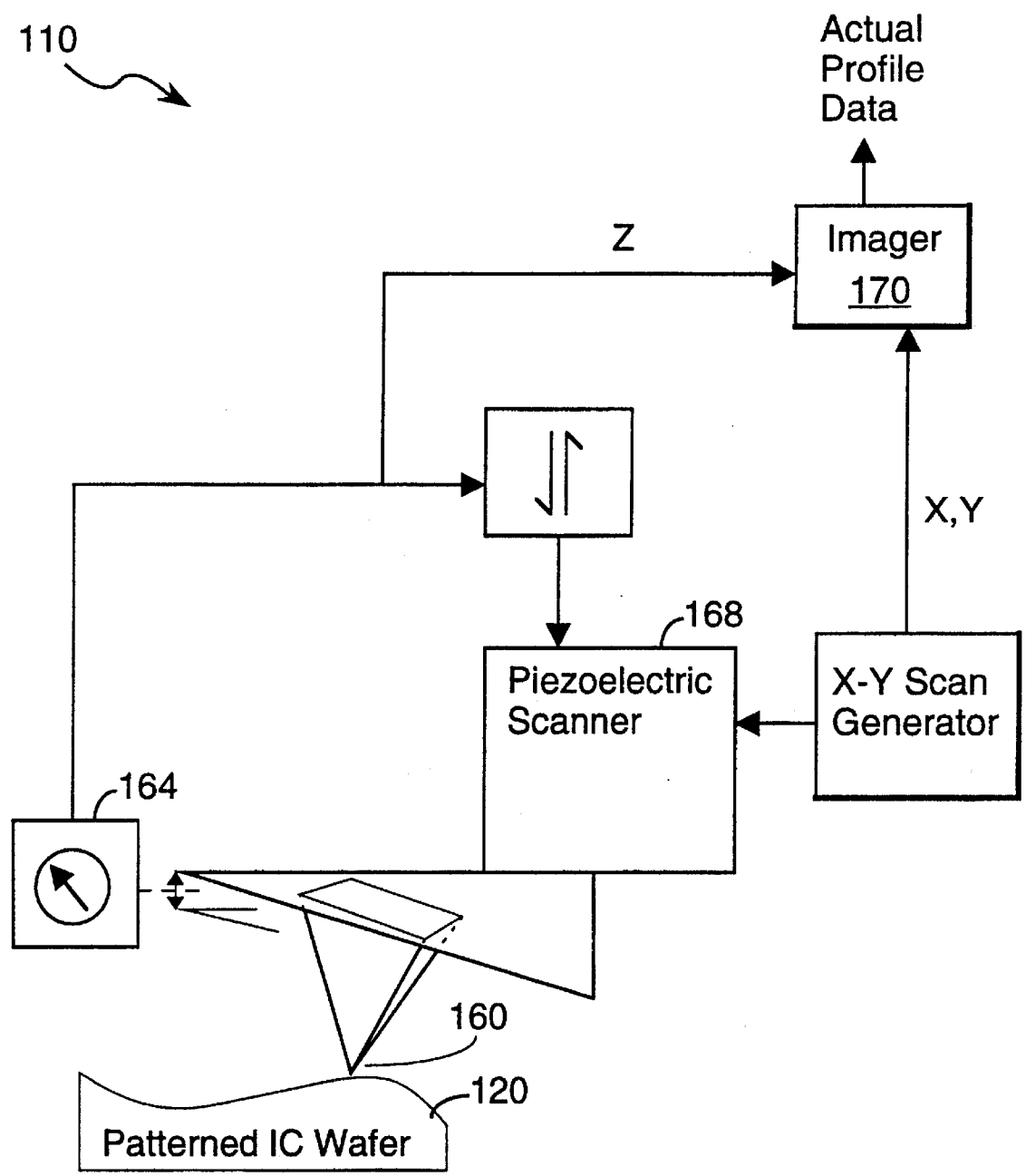
FIG. 3 is a block diagram of the atomic force microscope imaging system used in the model verification system of FIG. 2.

Referring to FIG. 3, there is shown a schematic of the AFM 110. As with many other AFMs, the preferred AFM 110 includes a probe tip 160 mounted on a cantilever 162, a feedback apparatus 164 to measure and control vertical deflection of the tip 160, and a piezoelectric scanner 168 that scans the tip across the patterned IC wafer 120 to be imaged. The AFM 110 also includes an image processor 170 which processes raw surface data from the AFM and outputs profile data corresponding to the patterned IC wafer 120.

At all times as the wafer 120 is being imaged by the AFM 110, the tip 160 is maintained by the feedback apparatus 164 in close proximity to the surface of the IC wafer 120 so that the atomic forces between atoms on the probe tip 160 and atoms on the surface 120 are stronger than the spring force of the cantilever 162. Consequently, as the tip 160 is moved by the scanner 168 across the IC wafer 120, the cantilever 162 deflects vertically in response to IC wafer 120 surface changes that alter the distance and therefore the forces between the tip atoms and the surface atoms. The feedback processor 164 measures the vertical or z axis deflection of the cantilever 162 and passes this information to the image processor 170, which combines the z deflection measurement with a corresponding x-y measurement position from the scanner 168. From the sequence of (x,y,z) measurements imaging the patterned resist 120, the image processor 170 outputs to the model updater 114 actual profile data 122 characterizing the cross section of the patterned IC wafer 120. Note that, for the AFM to image the sidewall of the resist, a flared probe tip must be used.

Because the AFM 110 images surfaces with force rather than current as does the SEM, the AFM 110 does not charge the edges of the surface features to be imaged. Consequently, AFM images show sharp, not blurred, edges. Additionally, the AFM does not physically alter the surface being characterized, with which the AFM does not come into contact. Moreover, because AFM surface images are not represented by photographs, but are instead digitally represented as arrays of x, y and z measurements, the errors associated with direct measurement of SEM photographs are eliminated by AFM metrology. As a result, AFM metrology is well suited to verification of submicron features modelled by IC process simulators such as PROLITH/2™.

Process Model

In the preferred embodiment of the present invention, the IC process model 112 is a well known photolithography model called PROLITH/2™. However, it should be apparent to anyone skilled in the art that the present verification model is not limited in its application, but can be readily applied to any model of an IC manufacturing process that patterns IC wafers.

Figure 1:
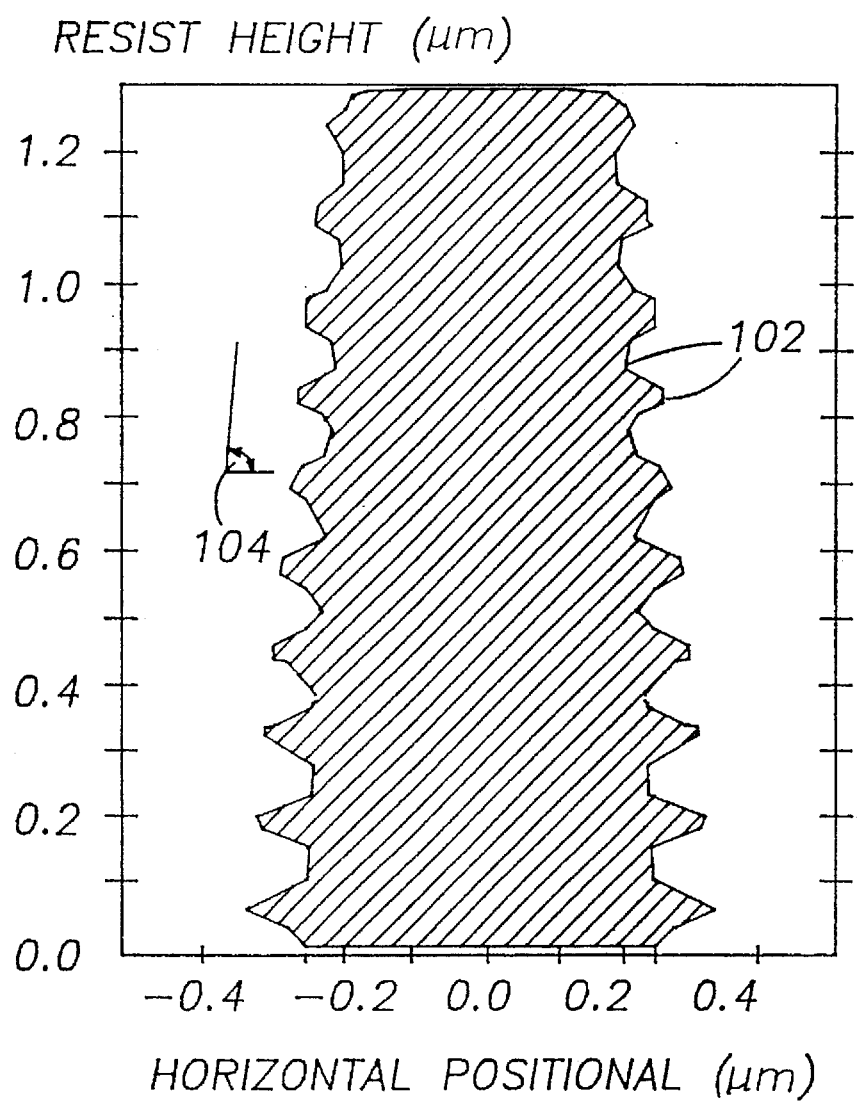
FIG. 1 is a cross sectional image of photoresist after photolithographic patterning showing standing wave and incoherence effects.

As set out above, the process model 112 computes a predicted profile 130 of an IC device manufactured according to a specific series of processing steps 127 for a predetermined set of environmental and processing conditions 126. This profile can be any possible profile of the IC wafer 120, but in the preferred embodiment is a cross section of the sidewalls of a patterned resist manufactured by photolithography as shown in FIG. 1, which profiles are modelled by PROLITH/2™.

In general application of the present invention, the process conditions will depend on the process being modelled and the process model. For PROLITH/2™, the environmental and processing conditions 126 characterize the following aspects of the photolithography process:

1) projection system (including wavelength, bandwidth, numerical aperture, fixed defocus, image defocus, partial coherence, linewidth, pitch, mask bias and focal position);

2) whether prebake conditions are used;

3) exposure energy;

4) PEB (post exposure bake) development time and temperature;

5) Whether CEL (contrast enhancement layer) and/or Top ARC (antireflection coating) are used;

6) number of intermediate layers;

7) substrate material; and 8) resist system (including whether the resist is positive or negative, thickness, absorption parameters A and B, rate constant C, and refractive index).

While the processing conditions and steps do not vary— they reflect the conditions under which the patterned IC wafer was manufactured—the results of the IC process model are determined by a set of adjustable internal model parameters that relate the processing steps 127 and conditions 126 to a resulting IC or resist profile/cross section. As the IC process model 112 of the present invention is well known (as is the process model, SAMPLE™, on which it is based), these internal model parameters are not fully described herein. However, to assist the explanation below of the model updater 114, a partial, illustrative list of parameters follows:

(1) PEB diffusion length: the degree of diffusion of the photoresist caused by a post exposure bake step; and (2) development model (maximum and minimum developing rates, threshold M, selectivity, relative surface rate and inhibition depth).

Initially, the process model is loaded with a set of initial model parameters 128 that are believed to accurately predict the cross-section of a patterned resist 120 manufactured according to process steps 127 executed under process conditions 126. However, when the profile 130 predicted by the IC process model 112 does not agree sufficiently well with the actual profile 122 of the IC wafer 120, the model parameters must be adjusted away from the initial model parameters in a manner calculated to result in predicted model results that more closely approximate reality. This adjusting/updating of the model parameters is performed by the model updater 114.

Model Updater

The model updater 114 first compares the predicted and actual profile data to determine whether the two sets of profile data are sufficiently similar as determined by preset error criteria (220).

When the predicted profile is not sufficiently similar to the actual profile (222-N), the model updater 114 generates a set of updated model parameters 134 for the IC process model 112 based on the differences between the actual profile data 122 and the predicted profile data 130. The set of updated parameters 134 is determined by the model updater 114 so that a subsequent predicted profile 130 computed by the process model 112 will more closely approximate the actual profile 122 than the predicted profile determined by the process model based on the previous set of model parameters.

For example, assume that the IC process model 112 predicts 130 that a developed positive photoresist would have a linewidth of 0.5 µm after processing at the base conditions 126, 127 but AFM metrology determines that the actual patterned IC wafer 120 processed at the same conditions has a linewidth of only 0.4 µm 122. As a result of this 20% disparity, the model updater 114 computes updated model parameters 134, including PEB diffusion length and some of the development model parameters (e.g., maximum developing rate and selectivity), which were set out above. In this example, the model updater 114 decreases the PEB diffusion length parameter as the overestimated linewidth indicates that there was less diffusion of the unexposed photoresist during the post exposure bake than was predicted by the IC process model 112 based on the PEB diffusion length included in the previous set of model parameters. The model updater 114 increases the maximum developing rate parameter as the AFM results indicate that the chemical developer removed the photoresist at a higher rate than accounted for in the previous set of model parameters. Finally, the model updater 114 adjusts the selectivity parameter downward, as the smaller than expected linewidth indicates that the developer's discrimination between exposed and unexposed resist was poorer than was predicted based on the previous set of model parameters.

When the actual profile and the predicted profile are sufficiently similar (222-Y), as determined by a predefined margin of error, the model updater passes the same set of model parameters back to the process model 112 as final model parameter 136. As described above, the process simulator 112 can then generate a sequence of processing steps that, when executed by the IC manufacturing process, will produce IC features that are correlated with either the patterned IC wafer 120 or other IC surface features specified for the same set of process conditions 126 (226).

The Verification Method

As stated above, FIG. 4 shows the steps of the present IC process model verification method. These steps have already been described in conjunction with the block descriptions. The first step (212) of the present method is providing a patterned photoresist manufactured by a photolithographic process at known base conditions that define all relevant aspects of the photolithography system and the processing steps (e.g., sequence and duration) used to pattern the photoresist. The cross section of the patterned photoresist is then characterized by the AFM (214). At some time unrelated to the occurrence of steps 212 and 214, a process model is loaded with a set of initial model parameters (216) and the process model computes a predicted profile (218), including linewidths, of a resist layer patterned by the same processing steps and at the same base conditions as the actual patterned photoresist. The predicted and actual profiles are then compared (220). If the profiles are correlated within a predefined tolerance (222-Y), the process model has been verified to be correct, and as a result, can be used to generated a sequence of photolithography steps to be carried out by a manufacturing process (226). If the profiles are not sufficiently alike, the model parameters are updated (224) and the process model is iterated with the newly updated model parameters (218).

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An apparatus for verifying a semiconductor process model comprising:
   (a) an atomic force microscope configured to measure an actual profile of a semiconductor device feature created during a processing step;
   (b) said semiconductor process model being configured to predict a profile of said feature under a set of model processing conditions specified to match actual processing conditions under which said processing step took place; said semiconductor process model having an associated set of process parameters relating said predicted profile to said model conditions and said processing step; and
   (c) a model updater configured to adjust said process parameters of said semiconductor process model so that said predicted profile more closely approximates said actual profile, said model updater iteratively adjusting said parameters until a final set of process parameters is arrived at for which said predicted profile approximates said actual profile within a predefined margin of error.

2. The apparatus of claim 1 wherein said processing step is photolithography, said feature is a photoresist layer patterned by said photolithography, and each of said profiles is a cross section of said photoresist described by at least one of a group of characteristics including (A) scalloping caused by standing waves caused by interference of said light used to expose said photoresist and (B) angle/slope of sidewalls of said patterned photoresist layer.

3. The apparatus of claim 1 further comprising an IC manufacturing facility, wherein said process model loaded with said final set of process parameters is additionally configured to generate a sequence of processing steps based on a desired IC surface profile to be manufactured and said model processing conditions and output said sequence to said manufacturing facility, which is configured to manufacture an IC in accordance with said sequence of processing steps; thereby allowing said manufacturing facility to manufacture said IC with said desired surface profile.

4. The apparatus of claim 1, wherein at least a subset of said process parameters is selected from:
   post exposure bake (PEB) diffusion length;
   maximum and minimum developing rates;
   threshold M;
   selectivity;
   relative surface rate; and
   inhibition depth.

5. The apparatus of claim 4, wherein at least a subset of said processing conditions is selected from:
   projection system characteristics, including at least one of: wavelength, bandwidth, numerical aperture, fixed defocus, image defocus, partial coherence, linewidth, pitch, mask bias and focal position;
   whether prebake conditions are used;
   exposure energy;
   PEB (post exposure bake) development time and temperature;
   whether CEL (contrast enhancement layer) and/or Top ARC (antireflection coating) are used;
   number of intermediate layers;
   substrate material; and
   resist system characteristics, including at least one of: whether said photoresist is positive or negative, thickness, absorption parameters A and B, rate constant C, and refractive index.

6. A method for verifying a semiconductor process model comprising the steps of:
   (a) measuring with an atomic force microscope an actual profile of a semiconductor device feature created during a processing step;
   (b) computing with said semiconductor process model a predicted profile of said feature under a set of model processing conditions specified to match actual processing conditions under which said processing step took place; said semiconductor process model having an associated set of process parameters that govern said computing step, said process parameters relating said predicted profile to said model processing conditions and said processing step;
   (c) adjusting said process parameters of said semiconductor process model, said process parameters determining said predicted profile under said set of model conditions, so that said predicted profile more closely approximates said actual profile; and
   (d) repeating steps (b) and (c) until a final set of process parameters is arrived at for which said predicted profile approximates said actual profile within a predefined margin of error.

7. The method of claim 6 further comprising a manufacturing step wherein said final set of process parameters are used to generate a sequence of manufacturing steps by which an IC surface can be manufactured having a set of desired features under said set of model processing conditions.

8. The method of claim 6, wherein at least a subset of said process parameters is selected from:
   post exposure bake (PEB) diffusion length;
   maximum and minimum developing rates;

threshold M;

selectivity;

relative surface rate; and inhibition depth.

9. The method of claim 8, wherein at least a subset of said processing conditions is selected from:

projection system characteristics, including at least one of: wavelength, bandwidth, numerical aperture, fixed defocus, image defocus, partial coherence, linewidth, pitch, mask bias and focal position;

whether prebake conditions are used;

exposure energy;

PEB (post exposure bake) development time and temperature;

whether CEL (contrast enhancement layer) and/or Top ARC (antireflection coating) are used;

number of intermediate layers;

substrate material; and resist system characteristics, including at least one of: whether said photoresist is positive or negative, thickness, absorption parameters A and B, rate constant C, and refractive index.

* * * * *